United States Patent
Isono et al.

(10) Patent No.: US 7,902,571 B2
(45) Date of Patent: Mar. 8, 2011

(54) III-V GROUP COMPOUND SEMICONDUCTOR DEVICE INCLUDING A BUFFER LAYER HAVING III-V GROUP COMPOUND SEMICONDUCTOR CRYSTAL

(75) Inventors: Ryota Isono, Hitachi (JP); Takashi Takeuchi, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 84 days.

(21) Appl. No.: 11/302,282

(22) Filed: Dec. 14, 2005

(65) Prior Publication Data

US 2007/0029640 A1 Feb. 8, 2007

(30) Foreign Application Priority Data

Aug. 4, 2005 (JP) .................................. 2005-227168

(51) Int. Cl.
*H01L 29/66* (2006.01)
(52) U.S. Cl. ......... 257/192; 257/183; 257/194; 257/615; 257/E29.246; 257/E21.371; 257/E21.387; 257/E21.403; 257/E21.407
(58) Field of Classification Search .................. 257/615, 257/E29.246, 194, 183, 192, E21.371, E21.387, 257/E21.403, E21.407
See application file for complete search history.

(56) References Cited

U.S. PATENT DOCUMENTS

| 4,236,166 | A | * | 11/1980 | Cho et al. ........................ 257/192 |
| 4,862,228 | A | * | 8/1989 | Ralph .............................. 257/14 |
| 5,038,187 | A | * | 8/1991 | Zhou ............................... 257/194 |
| 5,196,717 | A | * | 3/1993 | Hiroki et al. .................... 257/21 |
| 5,369,288 | A | * | 11/1994 | Usuki ............................. 257/26 |
| 5,610,410 | A | * | 3/1997 | Imanishi ......................... 257/76 |
| 6,325,849 | B1 | * | 12/2001 | Hideo et al. .................... 117/82 |
| 6,355,951 | B1 | * | 3/2002 | Hattori ........................... 257/280 |
| 6,429,103 | B1 | * | 8/2002 | Johnson et al. ................ 438/518 |
| 7,012,286 | B2 | * | 3/2006 | Inai et al. ...................... 257/192 |
| 2002/0069907 | A1 | * | 6/2002 | Yamashita ...................... 136/205 |
| 2002/0088994 | A1 | * | 7/2002 | Yamaki et al. ................. 257/192 |
| 2004/0266090 | A1 | * | 12/2004 | Nakamura ....................... 438/217 |

FOREIGN PATENT DOCUMENTS

JP 10-116837 5/1998

OTHER PUBLICATIONS

Ohno et al., "Suppression of GDS frequency dispersion in heterojunction FETs with a partially depleted p-type buffer layer", Solid-State Electronics 43 (1999) pp. 1339-1345.*

* cited by examiner

*Primary Examiner* — Kenneth A Parker
*Assistant Examiner* — Jay C Kim
(74) *Attorney, Agent, or Firm* — McGinn IP Law Group, PLLC

(57) ABSTRACT

A field effect transistor (FET) with high withstand voltage and high performance is realized by designing a buffer layer structure appropriately to reduce a leakage current to $1\times10^{-9}$ A or less when a low voltage is applied. An epitaxial wafer for a field effect transistor comprising a buffer layer 2, an active layer, and a contact layer on a semi-insulating substrate 1 from the bottom, and the buffer layer 2 includes a plurality of layers, and a p-type buffer layer composed of p-type $Al_xGa_{1-x}As$ ($0.3 \leq x \leq 1$) is provided as a bottom layer (undermost layer) 2a. A Nd product of a film thickness of the p-type buffer layer and a p-type carrier concentration of the p-type buffer layer is within a range from $1\times10^{10}$ to $1\times10^{12}/cm^2$.

2 Claims, 8 Drawing Sheets

| | | THICKNESS | CARRIER CONCENTRATION | |
|---|---|---|---|---|
| n-type GaAs | CONTACT LAYER | 100nm | $3\times10^{18}cm^{-3}$ | 7 |
| i-type $Al_{0.25}Ga_{0.75}As$ | SCHOTTKY LAYER | 50nm | $1\times10^{16}cm^{-3}$ OR LESS | 6 |
| n-type $Al_{0.25}Ga_{0.75}As$ | CARRIER SUPPLY LAYER | 250nm | $3\times10^{18}cm^{-3}$ | 5 |
| i-type $Al_{0.25}Ga_{0.75}As$ | SPACER LAYER | 3nm | $1\times10^{16}cm^{-3}$ OR LESS | 4 |
| i-type $In_{0.20}Ga_{0.80}As$ | CHANNEL LAYER | 20nm | $1\times10^{16}cm^{-3}$ OR LESS | 3 |
| i-type $Al_{0.25}Ga_{0.75}As$ | BUFFER LAYER | 100nm | $1\times10^{16}cm^{-3}$ OR LESS | |
| i-type $Al_{0.25}Ga_{0.75}As$ | BUFFER LAYER | 100nm | $1\times10^{16}cm^{-3}$ OR LESS | |
| i-type GaAs | BUFFER LAYER | 200nm | $1\times10^{15}cm^{-3}$ OR LESS | 2 |
| i-type $Al_{0.25}Ga_{0.75}As$ | BUFFER LAYER | 100nm | $1\times10^{16}cm^{-3}$ OR LESS | |
| i-type GaAs | BUFFER LAYER | 500nm | $1\times10^{15}cm^{-3}$ OR LESS | |
| p-type $Al_{0.50}Ga_{0.50}As$ | BUFFER LAYER | 10nm | $2\times10^{17}cm^{-3}$ | |
| GaAs | SUBSTRATE | — | — | 1 |

2b LAYERED PART brackets the upper i-type buffer layers; 2a BOTTOM LAYER (UNDERMOST LAYER) brackets the p-type $Al_{0.50}Ga_{0.50}As$ row.

⟨HEMT STRUCTURE⟩

FIG. 2

| | | THICKNESS | CARRIER CONCENTRATION | |
|---|---|---|---|---|
| n-type GaAs | CONTACT LAYER | 100nm | $3\times10^{18}cm^{-3}$ | 7 |
| i-type Al$_{0.25}$Ga$_{0.75}$As | SCHOTTKY LAYER | 50nm | $1\times10^{16}cm^{-3}$ OR LESS | 6 |
| n-type Al$_{0.25}$Ga$_{0.75}$As | CARRIER SUPPLY LAYER | 250nm | $3\times10^{18}cm^{-3}$ | 5 |
| i-type Al$_{0.25}$Ga$_{0.75}$As | SPACER LAYER | 3nm | $1\times10^{16}cm^{-3}$ OR LESS | 4 |
| i-type In$_{0.20}$Ga$_{0.80}$As | CHANNEL LAYER | 20nm | $1\times10^{16}cm^{-3}$ OR LESS | 3 |
| i-type Al$_{0.25}$Ga$_{0.75}$As | BUFFER LAYER | 100nm | $1\times10^{16}cm^{-3}$ OR LESS | 2b LAYERED PART |
| i-type Al$_{0.25}$Ga$_{0.75}$As | BUFFER LAYER | 100nm | $1\times10^{16}cm^{-3}$ OR LESS | |
| i-type GaAs | BUFFER LAYER | 200nm | $1\times10^{15}cm^{-3}$ OR LESS | |
| i-type Al$_{0.25}$Ga$_{0.75}$As | BUFFER LAYER | 100nm | $1\times10^{16}cm^{-3}$ OR LESS | |
| i-type GaAs | BUFFER LAYER | 500nm | $1\times10^{15}cm^{-3}$ OR LESS | |
| p-type Al$_{0.50}$Ga$_{0.50}$As | BUFFER LAYER | 10nm | $2\times10^{17}cm^{-3}$ | 2a BOTTOM LAYER (UNDERMOST LAYER) |
| GaAs | SUBSTRATE | — | — | 1 |

⟨METHOD OF MEASURING A LEAKAGE CURRENT IN A BUFFER LAYER WHEN A VOLTAGE IS APPLIED⟩

⟨RELATIONSHIP BETWEEN A Nd PRODUCT AND A LEAKAGE CURRENT WHEN A VOLTAGE IS APPLIED WHEREIN A MIX CRYSTAL RATIO IS 0.35⟩

⟨RELATIONSHIP BETWEEN A Nd PRODUCT AND A LEAKAGE CURRENT WHEN A VOLTAGE IS APPLIED WHEREIN A MIX CRYSTAL RATIO IS 0.55⟩

⟨RELATIONSHIP BETWEEN A Nd PRODUCT AND A LEAKAGE CURRENT WHEN A VOLTAGE IS APPLIED WHEREIN A MIX CRYSTAL RATIO IS 0.75⟩

⟨RELATIONSHIP BETWEEN AN OPTIMIZED CONDITION OF A Nd PRODUCT AND A MIX CRYSTAL RATIO⟩

III-V GROUP COMPOUND SEMICONDUCTOR DEVICE INCLUDING A BUFFER LAYER HAVING III-V GROUP COMPOUND SEMICONDUCTOR CRYSTAL

The present application is based on Japanese Patent Application No. 2005-227168 filed on Aug. 4, 2005, the entire contents of which are incorporated herein by reference.

BACKGROUND OF THE INVENTION

1. Field of the Invention

The present invention relates to a III-V group compound semiconductor device such as FET (Field Effect Transistor) and HEMT (High Electron Mobility Transistor), and more particularly to an improvement of a buffer layer in a III-V group compound semiconductor device.

2. Description of the Related Art

For improving a performance of a transistor, it is important to use a material that can transmit more majority carriers with a higher speed. GaAs (gallium arsenide) and InGaAs (indium gallium arsenide) are characterized by that the electron mobility is higher that that of Si (silicon). By utilizing this characteristic, the GaAs and InGaAs are employed frequently in a high-speed operation device. The HEMT (High Electron Mobility Transistor) may be cited for a representative example.

Now, for the field effect transistors such as FET or HEMT, it is common to use an epitaxial wafer comprising a semi-insulating GaAs substrate, a buffer layer and an active layer respectively grown by an epitaxial growth on the semi-insulating GaAs substrate.

FIG. 1 is an explanatory diagram showing a schematic structure of the HEMT.

The HEMT comprises a buffer layer 2, a channel layer 3, a spacer layer 4, a carrier supply layer 5, and a contact layer 7, successively grown on a substrate 1 by a crystal growth method. The contact layer 7 is a layer for forming an electrode (not shown) thereon. The carrier supply layer 5 is a layer for generating free electrons and supplying them to the channel layer 3. The channel layer 3 is a layer through which the free electrons are flown, therefore the channel layer 3 should have a high purity.

The buffer layer 2 is provided for preventing an active layer from being effected by a defect layer generated at an interface between the substrate and the epitaxial crystal. However, it is assumed that an electric current will leak from the active layer into the buffer layer if this buffer layer has a low resistance. Therefore, it is required that the buffer layer 2 is made of the epitaxial crystal having a high resistance. For increasing the resistance of the buffer layer, it is necessary to decrease an impurity concentration of the buffer layer, or to increase a height of a hetero barrier.

Since the current leakage into the buffer layer significantly deteriorates device characteristics of a conventional field effect semiconductor device that is manufactured by growing a p-type buffer layer and a channel layer on a p-type semiconductor substrate by epitaxial grown, an acceptor concentration of the p-type buffer layer is within a range from $5 \times 10^{16}/cm^3$ to $5 \times 10^{15}/cm^3$ for suppressing the leakage current. Japanese Patent Laid-Open No. 10-116837 (JP-A-10-116837) discloses such conventional field effect semiconductor device.

However, an issue of a p-type concentration has not been discussed conventionally in connection with a mix crystal ratio of Al and a film thickness of the buffer layer.

The Inventors of the present application have found following facts as a result of their serious studies and efforts. In other words, the problem in the aforementioned disadvantage is that a conductive layer having a low resistance exists at an interface of a semi-insulating substrate and an epitaxial layer of the epitaxial wafer grown by the crystal growth method. When a field effect transistor such as HEMT is manufactured by using such epitaxial wafer, a leakage current is flown between a source electrode and a drain electrode via the conductive layer formed at the interface of the epitaxial layer and substrate. Therefore, the electric characteristics of the transistor will be deteriorated. The cause why the low resistance layer is formed may be assumed as follows. For example, silicon existing everywhere e.g. in the atmosphere and dopant materials remained in a growth furnace may be deposited on a surface of a pre-growth substrate, and may remain on the substrate after growth to become a n-type carrier finally.

SUMMARY OF THE INVENTION

Accordingly, for solving the above problems, it is an object of the invention to provide a III-V group compound semiconductor device, in which a leakage current between electrodes is further decreased to be $1 \times 10^{-9}$ A or less so as to realize high withstand voltage and high performance, by constituting an appropriate buffer structure.

According to a first feature of the invention, a III-V group compound semiconductor device, comprises:
a semi-insulating substrate, and
a buffer layer, an active layer, and a contact layer sequentially formed on the semi-insulating substrate;
wherein the buffer layer comprises a plurality of layers including a p-type buffer layer composed of $Al_xGa_{1-x}As$ ($0.3 \leq x \leq 1$) as a bottom layer.

A second feature of the invention, in the III-V group compound semiconductor device, a Nd product defined as a product of a film thickness of the p-type buffer layer and a p-type carrier concentration of the p-type buffer layer is within a range from $1 \times 10^{10}$ to $1 \times 10^{12}/cm^2$.

According to a third feature of the invention, in the III-V group compound semiconductor device, the p-type carrier concentration is a concentration of at least one of oxygen and transition metal.

According to a fourth feature of the invention, in the III-V group compound semiconductor device, a thickness of the p-type buffer layer composed of $Al_xGa_{1-x}As$ is 2 to 50 nm.

According to a fifth feature of the invention, in the III-V group compound semiconductor device, the active layer has a structure of FET.

According to a sixth feature of the invention, in the III-V group compound semiconductor device, the active layer has a structure of HEMT.

According to a seventh feature of the invention, a III-V group compound semiconductor device, comprises:
a semi-insulating substrate; and
a buffer layer, an active layer, and a contact layer sequentially formed on a semi-insulating substrate;
wherein the buffer layer comprises a p-type $Al_xGa_{1-x}As$ buffer layer ($0.3 \leq x \leq 1$) as a bottom layer, and a layered part composed of $GaAs/Al_xGa_{1-x}As$ hetero structures that are grown more than twice, in which a GaAs layer and an $Al_xGa_{1-x}As$ layer ($0 \leq x \leq 1$) are alternately layered.

In the present invention, the leakage current between the electrodes is reduced by limiting a range of a Nd product of $Al_xGa_{1-x}As$ layer which is an bottom (undermost) layer in the buffer layer. Through the present application, the "Nd product" means a product of a film thickness (d) of a p-type buffer layer and a p-type carrier concentration (N) of at least one of oxygen and transition metal of the p-type buffer layer.

According to the present invention, it is possible to reduce the leakage current in case where a low voltage is applied to the device. In other words, the III-V group compound semiconductor crystal in the buffer layers is formed to have a high resistance, so that the III-V group compound semiconductor device such as FET or HEMT with a high withstand voltage and high performance can be realized.

BRIEF DESCRIPTION OF THE DRAWINGS

The present invention will be explained in more detail in conjunction with appended drawings, wherein:

FIG. 2 is an explanatory diagram showing schematic cross sectional view of the HEMT structure in a preferred embodiment according to the present invention;

DESCRIPTION OF THE PREFERRED EMBODIMENT

Figure 1:
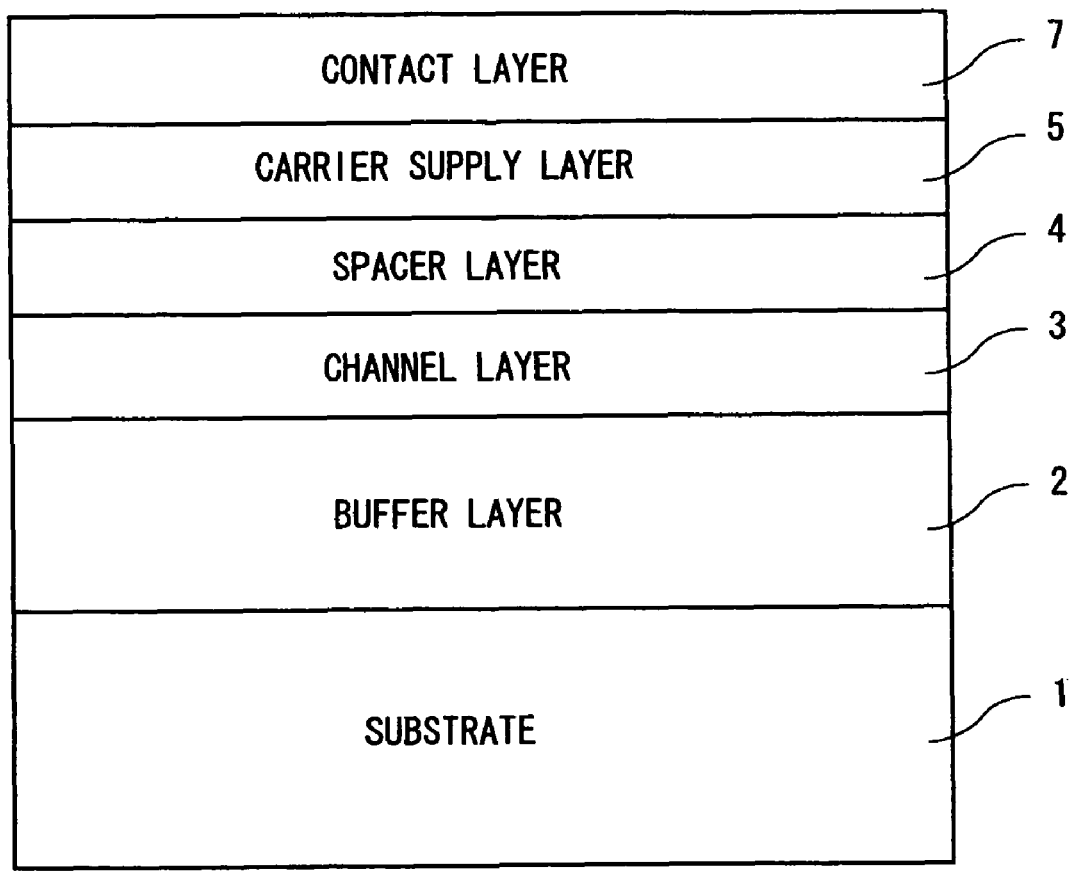
FIG. 1 is an explanatory diagram showing a cross sectional view of a HEMT structure which is applied to the present invention.

Preferred embodiment according to the present invention will be explained in detail hereinafter by referring to the appended drawings.

FIG. 2 shows a schematic cross section of a HEMT epitaxial wafer in a preferred embodiment according to the present invention.

A mixture gas of III group organic metal source gas, V group source gas and high purity hydrogen carrier gas is supplied to a reacting furnace. Raw materials in the mixture gas are thermally decomposed in vicinity of a substrate 1 heated in the reacting furnace, and epitaxially grown on the substrate 1. By using this organic metal vapor growth method (Metal Organic Vapor Phase Epitaxy, hereinafter referred as "MOVPE method"), a p-type AlGaAs layer having a Nd product within a predetermined range is interposed as a bottom layer (undermost layer) 2a of a multi-layered buffer layer 2. According to this process, it is possible to grown the III-V group compound semiconductor crystal with a high resistance and high withstand voltage. A substrate temperature for the growth is 650° C., a growth furnace pressure is 76 Torr, and a dilution gas is hydrogen. A GaAs substrate is used for the substrate 1.

The III-V group compound semiconductor device in the preferred embodiment comprises a semi-insulating substrate 1, and a buffer layer 2, a channel layer 3, a spacer layer 4, a carrier supply layer 5, a gate contact layer (a Schottky layer) 6, and a contact layer 7 which are sequentially grown on the semi-insulating substrate 1.

In concrete, the III-V group compound semiconductor device is composed of a semi-insulating GaAs substrate 1; a multi-layered buffer layer 2; an i-type $In_{0.20}Ga_{0.80}As$ channel layer 3 (a thickness of 20 nm, a carrier concentration of $1\times10^{16}/cm^3$ or less); an i-type $Al_{0.25}Ga_{0.75}As$ spacer layer 4 (a thickness of 3 nm, a carrier concentration of $1\times10^{16}/cm^3$ or less); a n-type $Al_{0.25}Ga_{0.75}As$ carrier supply layer 5 (a thickness of 250 nm, a carrier concentration of $3\times10^{18}/cm^3$); an i-type $Al_{0.25}Ga_{0.75}As$ gate contact (Schottky) layer 6 (a thickness of 50 nm, a carrier concentration of $1\times10^{16}/cm^3$ or less); and a n-type GaAs contact layer 7 (a thickness of 100 nm, a carrier concentration of $3\times10^{18}/cm^3$) sequentially grown on the semi-insulating GaAs substrate 1 by using the MOVPE method.

The multi-layered buffer layer 2 comprises a layered part 2b and a bottom layer (undermost layer) 2a provided beneath the layered part 2b. Namely, the multi-layered buffer layer 2 comprises the bottom layer 2a and the layered part 2b grown on the bottom layer 2a. The layered part 2b is composed of $GaAs/Al_xGa_{1-x}As$ hetero structures that are grown more than twice, in which GaAs layer and $Al_xGa_{1-x}As$ layer ($0 \leq x \leq 1$) are alternately layered. The bottom layer 2a is composed of p-type $Al_xGa_{1-x}As$ ($0.3 \leq x \leq 1$).

In this preferred embodiment, as the bottom layer 2a in the buffer layer 2, a p-type $Al_{0.50}Ga_{0.50}As$ layer 2a (a thickness of 10 nm, a carrier concentration of $2\times10^{17}/cm^3$) is provided. Then, a Nd product of a film thickness (10 nm) of the bottom layer 2a in the buffer layer 2 and a p-type carrier concentration of the bottom layer 2a doped with oxygen or transition metal is determined to be within a range of $1\times10^{10}$ to $1\times10^{13}/cm^2$. As for the transitional metal, at least one metal is arbitrarily selected from a group consisting of Ti (titanium), Cr (chrome), Fe (iron), Co (cobalt), Ni (nickel), and Cu (copper).

In the above, for the growth of the p-type $Al_{0.50}Ga_{0.50}As$ layer which is the bottom layer 2a in the buffer layer 2, $Ga(CH_3)_3$ (trimethyl gallium), $Al(CH_3)_3$ (trimethylaluminum) and $AsH_3$ (arsine) is used, and those flow rates are 5.3 $cm^3/min.$, 2.20 $cm^3/min.$ and 250 $cm^3/min.$, respectively.

For the growth of the i-type GaAs layer for the buffer layer 2, $Ga(CH_3)_3$ and $AsH_3$ are used. A flow rate of $Ga(CH_3)_3$ is 10.5 $cm^3/min.$ A flow rate of $AsH^3$ is 315 $cm^3/min.$ For the growth of the i-type $Al_{0.25}Ga_{0.75}As$ layer for the buffer layer 2, spacer layer 4, and gate contact layer 6, $Ga(CH_3)_3$, $Al(CH_3)_3$ and $AsH_3$ is used, and those flow rates are 5.3 $cm^3/min.$, 1.43 $cm^3/min.$ and 630 $cm^3/min.$, respectively.

For the growth of the i-type $In_{0.20}Ga_{0.80}As$ layer for the channel layer 3, $Ga(CH_3)_3$, $In(CH_3)_3$ and $AsH_3$ are used, and those flow rates are 5.3 $cm^3/min.$, 2.09 $cm^3/min.$ and 500 $cm^3/min.$, respectively.

For the growth of the n-type $Al_{0.25}Ga_{0.75}As$ layer for the carrier supply layer 5, $Si_2H_6$ is used as well as Ga $(CH_3)_3$, Al $(CH_3)_3$, and $AsH_3$ that are used for the growth of the i-type $Al_{0.25}Ga_{0.75}As$ layer. A flow rate of $Si_2H_6$ is $7.78\times10^{-3}$ $cm^3/min.$ Flow rates of $Ga(CH_3)_3$, $Al(CH_3)_3$, and $AsH_3$ other than $Si_2H_6$ are equal to those used for the growth of the i-type $Al_{0.25}Ga_{0.75}As$ layer.

For the growth of a n-type GaAs layer for the contact layer 7, $Si_2H_6$ and $AsH_3$ is used as well as $Ga(CH_3)_3$ which is used for the growth of the i-type GaAs layer. A flow rate of $SiH_6$ is $1.47\times10^{-4}$ cm$^3$/min.

According to the present invention, in a III-V group compound semiconductor device such as FET or HEMT, a p-type $Al_xGa_{1-x}As$ layer ($0.3 \leq x \leq 1$) is provided as a bottom layer (undermost layer) in a multi-layered buffer layer. By lifting a band with a p-type layer, it is possible to suppress a leakage current flown into a buffer layer side. In other words, even if the Nd product is identical, the leakage current can be decreased by increasing a mix crystal ratio x for the p-type $Al_xGa_{1-x}As$ layer to be 0.3 or more.

Figure 7:
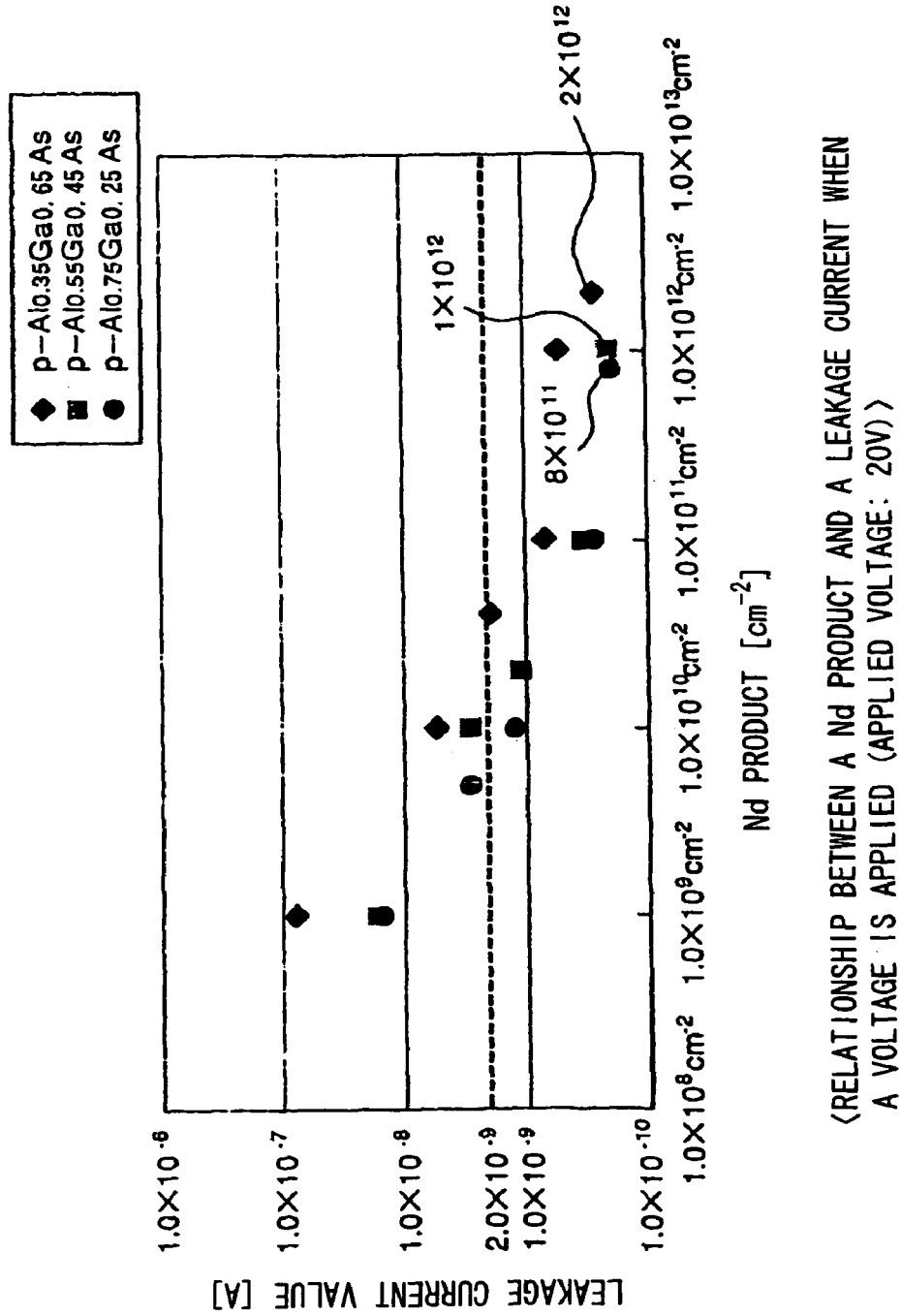
FIG. 7 is a graph showing a relationship between a ND product and a leakage current of a bottom layer in buffer layers of a HEMT in experimental samples.

FIG. 7 shows that the leakage current is decreased in accordance with the increase of the mix crystal ratio x, wherein x=0.35, x=0.55, and x=0.75.

Figure 8:
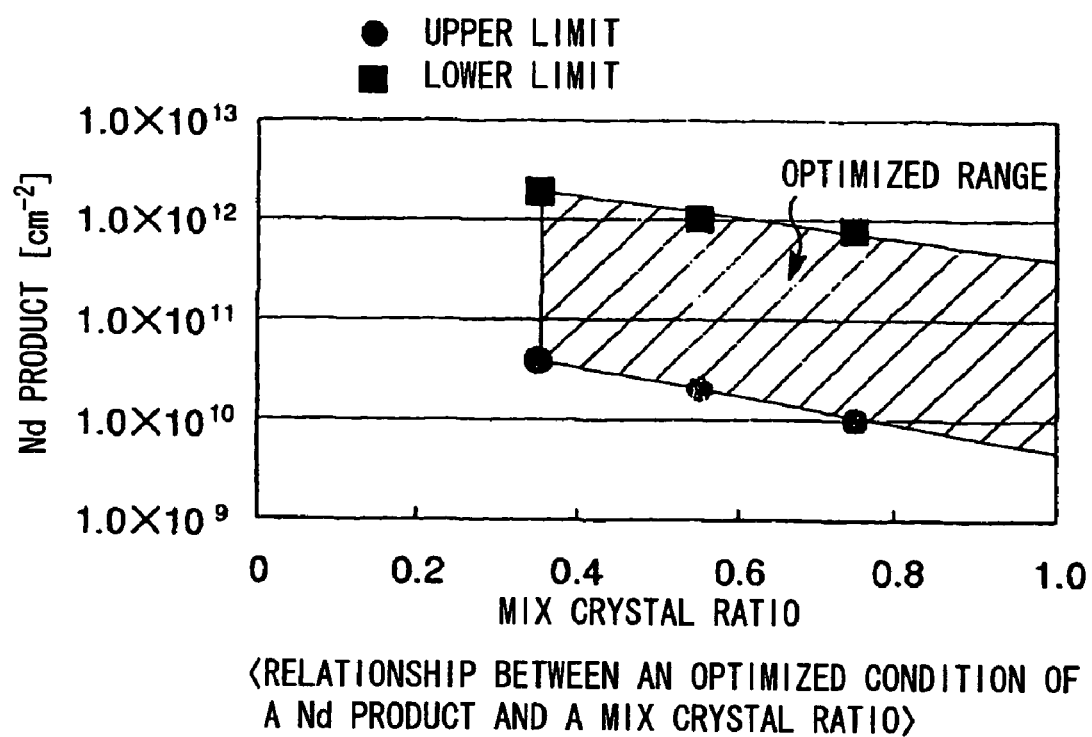
FIG. 8 is a graph showing an optimum condition of a Nd product when mix crystal ratio is varied in the present invention.

Further, the III-V group compound semiconductor device according to the present invention is construed such that the Nd product of a film thickness (d) of the p-type buffer layer and a p-type carrier concentration (N) of the p-type buffer layer is within a range from $1\times10^{10}$ to $1\times10^{12}$/cm$^2$. FIG. 8 shows an optimized range of the Nd product.

As described above, by determining the film thickness of the buffer layer and the p-type carrier concentration of the bottom layer in the buffer layer, it is possible to reduce the leakage current so as to realize the field effect transistor with high withstand voltage and high performance.

Next, the optimized conditions for the present invention will be explained below.

Figure 3:
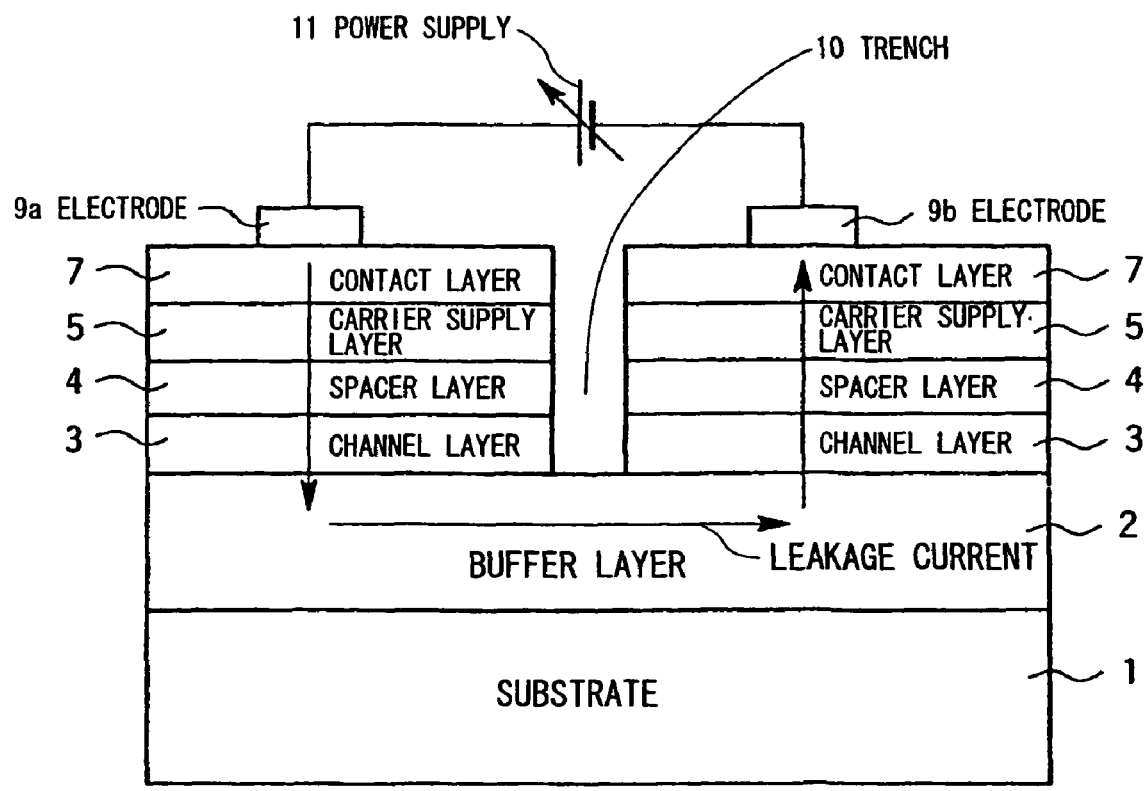
FIG. 3 is a schematic diagram showing a method for measuring a leakage current in the buffer layer when a voltage is applied.

So as to confirm the effect of the invention, a leakage current in the epitaxial wafer doped with oxygen or transition metal is measured, in a range where the Nd product is from $1\times10^9$ to $2\times10^{12}$/cm$^2$. FIG. 3 shows a measuring method, and FIGS. 4 to 6 show the measuring results.

The manner of conducting the measurement is shown in FIG. 3. For conducting the measurement, a part of each of the contact layer 7, carrier supply layer 5, spacer layer 4, and channel layer 3 is removed to provide a trench 10, and electrodes 9a and 9b are provided at two points of a surface of the contact layer 7. Then, a current value when a voltage is applied from a power supply 11 to terminals of the both electrodes 9a, 9b is measured.

Figure 4:
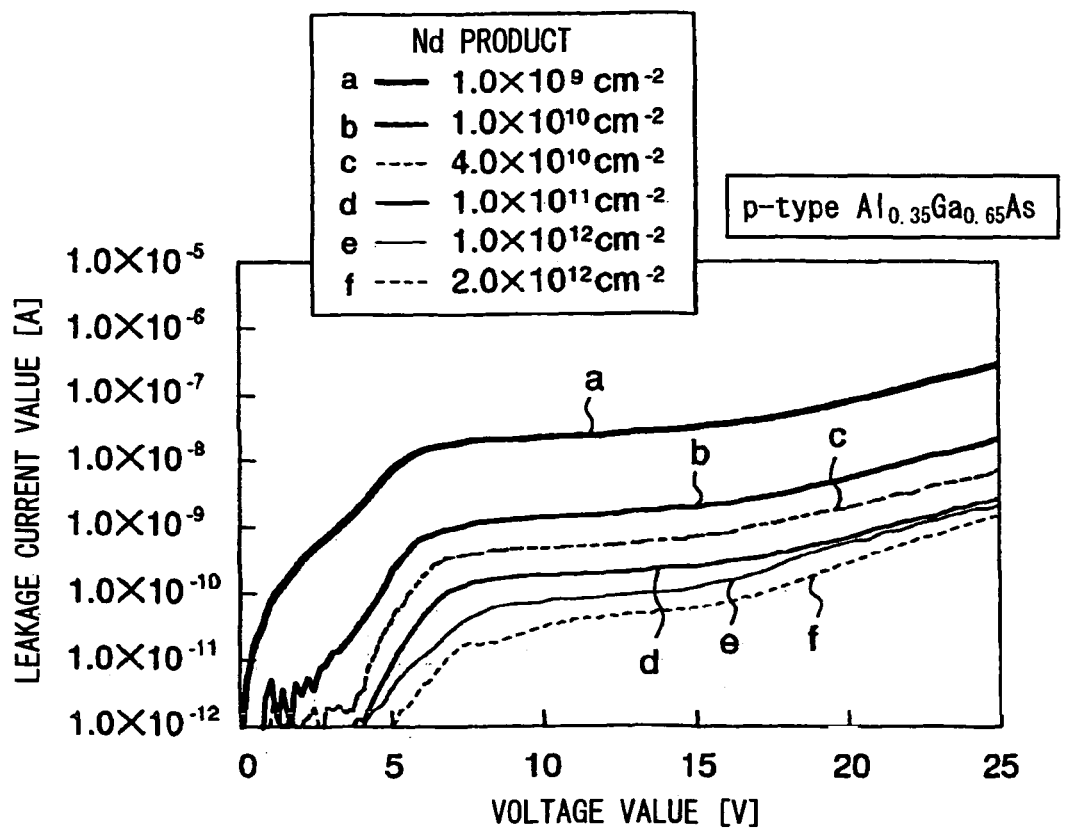
FIG. 4 is a graph showing a relationship between a Nd product and a leakage current wherein a mix crystal ratio is 0.35 in the preferred embodiment according to the present invention.
Figure 5:
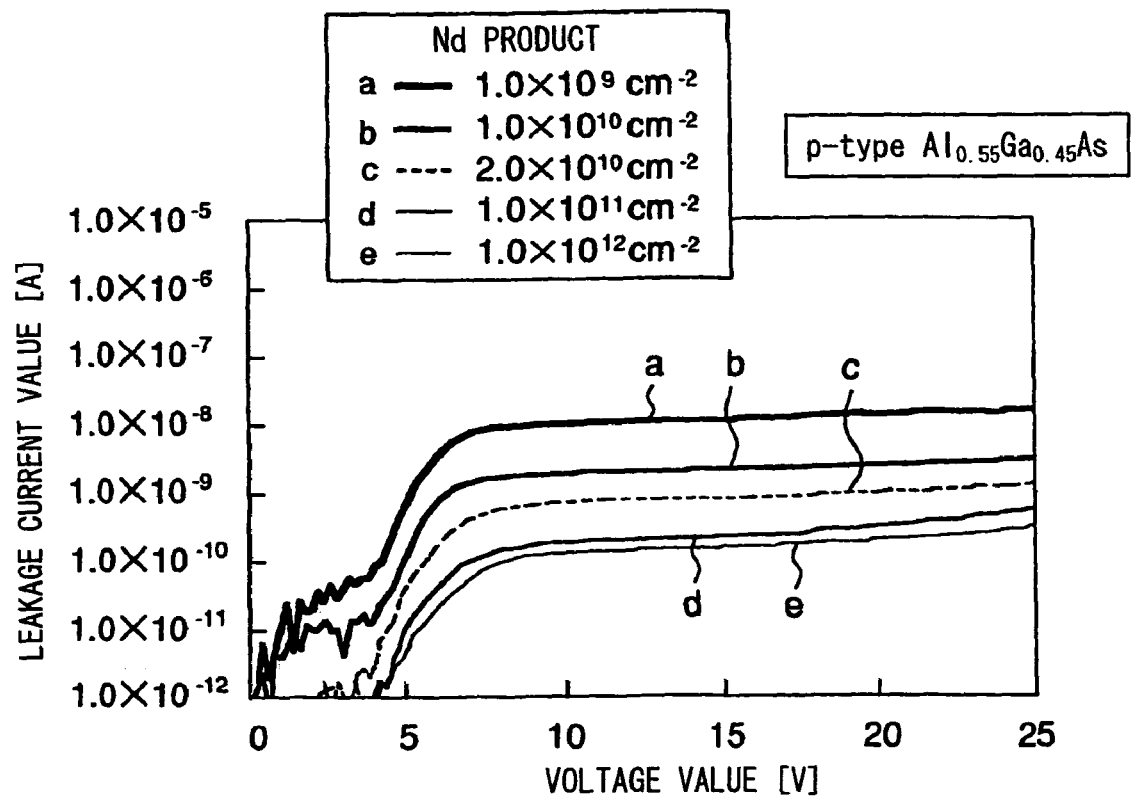
FIG. 5 is a graph showing a relationship between a Nd product and a leakage current wherein a mix crystal ratio is 0.55 in the preferred embodiment according to the present invention.
Figure 6:
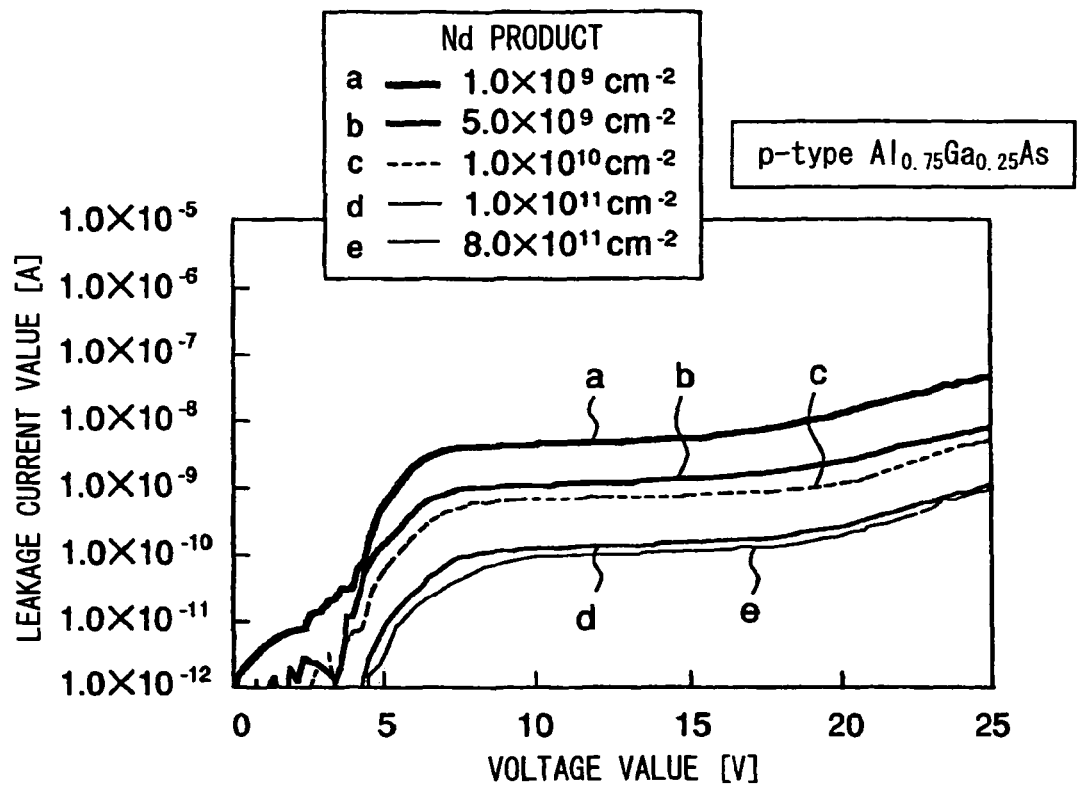
FIG. 6 is a graph showing a relationship between a Nd product and a leakage current wherein a mix crystal ratio is 0.75 in the preferred embodiment according to the present invention.

FIGS. 4 to 6 shows measuring results of the leakage current. When the Nd product of the bottom layer 2a in the buffer layer 2 is increased from $1\times10^9$/cm$^2$ to $2\times10^{12}$/cm$^2$, the leakage current is decreased.

FIG. 7 shows a relationship between the Nd product and leakage current when a voltage is applied (applied voltage: 20V). Even if the Nd product is identical for all samples, the leakage current value can be reduced by increasing a mix crystal ratio x for the p-type $Al_xGa_{1-x}As$, as shown in FIG. 7.

In FIG. 7, the relationship between the Nd product and leakage current when a voltage is applied (applied voltage: 20V) is shown, wherein an Al composition (mix crystal ratio) x of the p-type buffer layer (the bottom layer 2a) composed of $Al_xGa_{1-x}As$ is used as parameter in cases where x=0.35, x=0.55, and x=0.75. FIG. 7 may be analyzed with remarking right side ends of these curves. The oxygen or transition metal may be diffused in an active layer, in an area where the Nd product of the p-type buffer layer is greater than these right side ends, i.e. the Nd product of the p-type buffer layer is greater than the points where the mix crystal ratio x is 0.35 (x=0.35) and the Nd product is $2\times10^{12}$/cm$^2$, the mix crystal ratio x is 0.55 (X=0.55) and the Nd product is $1\times10^{11}$/cm$^2$, and the mix crystal ratio x is 0.75 (x=0.75) and the Nd product is $8\times10^{11}$/cm$^2$. As a result, an impurity diffusion of travel electron might be occurred in vicinity of the active layer and buffer layer due to the oxygen or transition metal diffused in the active layer. In addition, if the p-type buffer layer (the bottom layer 2a) is too thick, the resistance will be fallen down. On the other hand, if the p-type buffer layer (the bottom layer 2a) is too thin, the p-type buffer layer (the bottom layer 2a) will not complete an original function of the buffer layer to prevent an effect of the active layer on a defect layer produced in the interface between the substrate and epitaxial crystal.

FIG. 8 shows an optimized range of the Nd product of the p-type buffer layer in respective mix crystal ratios.

As clearly understood from FIG. 8, a mix crystal ratio x of $Al_xGa_{1-x}As$ of the p-type buffer layer (bottom layer 2a) may be preferably in a range from 0.3 to 1.0 as an optimized range for realizing a little leakage current.

In addition, it is preferable that a top layer (uppermost layer) constituting the buffer layer is composed of undoped epitaxial crystal, so as to prevent an impurity diffusion of the travel electron due to the oxygen or transition metal as a dopant in vicinity of the active layer and buffer layer, caused by the oxygen or transition metal diffused in the active layer.

Other preferred embodiments and variations of the present invention will be explained below.

In the III-V group compound semiconductor crystal composing a semiconductor device according to the present invention, III group element is composed of at least one of In (indium) as well as Ga (gallium), Al (aluminum), and V group element is composed of at least one of P (phosphor) as well as As (arsenic). By a combination thereof, the III-V group compound semiconductor crystal may be used by applying a binary system crystal to a quaternary system, e.g. InGaAs, AlInAs, AlGaInAs, GaP, AlP, InP, AlGaP, GaInP, AlGaIn, etc., as well as GaAs and $Al_xGa_{1-x}As$.

In addition, a product of a film thickness and a carrier concentration can be determined for the growth of a buffer layer in a HBT (heterojunction bipolar transistor).

The present invention can be applied to a semiconductor integrated circuit (IC) mainly composed of FET or HEMT as well as electronic devices such as FET or HEMT. In addition, the present invention can be also applied to a light emitting/receiving device, or a buried resistance layer for a laser.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching herein set forth.

What is claimed is:

1. A III-V group compound semiconductor device, comprising:
   a semi-insulating substrate; and
   a buffer layer, an active layer, and a contact layer sequentially formed on the semi-insulating substrate,
   wherein the buffer layer comprises a plurality of layers, comprising:
      a p-type buffer layer comprising $Al_xGa_{1-x}As$ ($0.3 \leq x \leq 1$, where x represents a mix crystal ratio of Al) as a bottom layer; and
      a layered part comprising a plurality of undoped GaAs/$Al_yGa_{1-y}As$ hetero structures ($0 \leq y \leq 0.3$, where y represents a mix crystal ratio of Al) formed directly on the p-type $Al_xGa_{1-x}As$ buffer layer, the p-type $Al_xGa_{1-x}As$ buffer layer being formed between the semi-insulating substrate and the layered part,
   wherein an Nd product defined as a product of a film thickness of the p-type buffer layer and a p-type carrier concentration of the p-type buffer layer is within a range from $1\times10^{10}$ to $1\times10^{12}/cm^2$, wherein the p-type carrier concentration comprises a concentration of at least one of oxygen and a transition metal selected from the group consisting of Ti, Cr, Fe, Co, Ni, and Cu, and wherein the film thickness of the p-type buffer layer comprising $Al_xGa_{1-x}As$ is 2 to 50 nm.

2. A III-V group compound semiconductor device, comprising:

a semi-insulating substrate, and a buffer layer, an active layer, and a contact layer sequentially formed on the semi-insulating substrate, wherein the buffer layer comprises a plurality of layers, comprising:

a p-type buffer layer comprising $Al_xGa_{1-x}As$ ($0.3 \leq x \leq 1$, where x represents a mix crystal ratio of Al) as a bottom layer; and a layered part comprising a plurality of undoped GaAs/$Al_yGa_{1-y}As$ hetero structures ($0 \leq y \leq 0.3$, where y represents a mix crystal ratio of Al) formed directly on the p-type buffer layer, the p-type buffer layer being formed between the semi-insulating substrate and the layered part, wherein an Nd product defined as a product of a film thickness of the p-type buffer layer and a p-type carrier concentration of the p-type buffer layer is within a range from $1\times10^{10}$ to $1\times10^{12}/cm^2$, wherein the p-type carrier concentration comprises a concentration of a transition metal selected from the group consisting of Ti, Co, Ni, and Cu, and wherein the film thickness of the p-type buffer layer comprising $Al_xGa_{1-x}As$ is 2 to 50 nm.

* * * * *